US009665672B2

(12) United States Patent
Dufour

(10) Patent No.: US 9,665,672 B2
(45) Date of Patent: May 30, 2017

(54) METHOD AND SYSTEM FOR REDUCING POWER LOSSES AND STATE-OVERSHOOTS IN SIMULATORS FOR SWITCHED POWER ELECTRONIC CIRCUIT

(71) Applicant: Christian Dufour, Lévis (CA)

(72) Inventor: Christian Dufour, Lévis (CA)

(*) Notice: Subject to any disclaimer, the term of this patent is extended or adjusted under 35 U.S.C. 154(b) by 90 days.

(21) Appl. No.: 14/545,358

(22) Filed: Apr. 27, 2015

(65) Prior Publication Data

US 2016/0314230 A1  Oct. 27, 2016

(51) Int. Cl.
*G06F 9/455* (2006.01)
*G06F 17/50* (2006.01)

(52) U.S. Cl.
CPC ...... *G06F 17/5036* (2013.01); *G06F 17/5045* (2013.01)

(58) Field of Classification Search
USPC ........ 716/106, 109, 108, 111, 113, 132, 133, 716/134
See application file for complete search history.

(56) References Cited

U.S. PATENT DOCUMENTS

| 2008/0103632 A1* | 5/2008 | Saban | ...................... | H02K 3/28 |
| | | | | 700/286 |
| 2010/0106476 A1* | 4/2010 | Dong | .................. | G06F 17/5036 |
| | | | | 703/14 |

OTHER PUBLICATIONS

[Dommel] H.W. Dommel, "Digital computer solution of electromagnetic transients in single- and multiphase networks," IEEE Trans. Power App. Syst., vol. PAS-88, No. 4, pp. 388-399, Apr. 1969.
[Pejovic] P. Pejovic and D. Maksimovic, "A method for fast time-domain simulation of networks with switches," IEEE Transactions on Power Electronics, vol. 9, No. 4, pp. 449-456, Jul. 1994.
[Hui] S. Hui and C. Christopoulos, "A Discrete Approach to the Modeling of Power Electronic Switching Networks", IEEE Trans. on Power Electronics, vol. 5, No. 4, pp. 398-403, Oct. 1990.
[Maguire] T.L. Maguire and W.J. Giesbrecht, "Small Time-Step (<2µSec) VSC Model for the Real Time Digital Simulator" in Proc. IPST 2005, Montreal Canada, Jun. 2005, Paper No. IPST05-168-25c.

(Continued)

*Primary Examiner* — Brian Ngo
(74) *Attorney, Agent, or Firm* — Rama B Nath

(57) ABSTRACT

A simulator for a switched electronic power converter circuit feeding a load/device uses a modified FAMNM solver. Provided is a method/system for reducing/eliminating spurious power losses and transients inherently caused by the FAMNM solver using an L/C element approach, wherein a switching device in the 'on' state is featured as an inductor L, and a switching device that is in the 'off' state is featured as either a capacitance C or series-connected resistance and capacitance R-C. The invention uses cross-initialization of the L/C switching elements to their final state of current and voltage when they change their conduction state. The correct cross-initialization is enabled from optional pre-stored tables of events and the system-states at the time of the cross-initialization. The inventive method is an enhancement over known Dommel and Pejovic type FAMNM solvers. The simulator applies to real-time or non-real time simulators and is suitable for all power converter topologies.

25 Claims, 16 Drawing Sheets

(56) References Cited

OTHER PUBLICATIONS

[Dufour] C. Dufour, S. Cense, T. Ould Bachir, L.-A. Grégoire, J. Bélanger, "General-purpose reconfigurable low-latency electric circuit and drive solver on FPGA", 38th Annual Conference of the IEEE Industrial Electronics Society (IECON-2012), Montréal, Canada, Oct. 25-28, 2012.
[Matar] M. Matar, R. Iravani, "FPGA implementation of the power electronic converter model for real-time simulation of electromagnetic transients," IEEE Trans. on Power Delivery, vol. 25, No. 2, pp. 852-860, Apr. 2010.
[Razzaghi ] R. Razzaghi, C. Foti, M. Paolone, F. Rachidi, "A method for the assessment of the optimal parameter of discrete-time switch model", Electric Power Systems Research, vol. 115, Oct. 2014, pp. 80-86 available at http://www.sciencedirect.com/science/article/pii/S0378779614000455.
[Song] Y. Song and B. Wang, "Survey on Reliability of Power Electronic Systems", IEEE Transaction on Power Electronics, vol. 28, No. 1, Jan. 2013.
[Ould Bachir] T. Ould Bachir, C. Dufour, J. Bélanger, J. Mahseredjian, J.P. David, J.P "A fully automated reconfigurable calculation engine dedicated to the real-time simulation of high switching frequency power electronic circuits" Mathematics and Computers in Simulation, vol. 91, May 2013, pp. 167-177.

\* cited by examiner

Zoom of previous Fig 6

METHOD AND SYSTEM FOR REDUCING POWER LOSSES AND STATE-OVERSHOOTS IN SIMULATORS FOR SWITCHED POWER ELECTRONIC CIRCUIT

BACKGROUND OF THE INVENTION

This invention generally relates to simulators in switched power electronic circuits and more particularly to a method and system for reducing spurious power losses and signal overshoots in real-time/non real-time simulators for switched power electronic circuits.

A real-time simulator is a device that emulates the real-time behaviour of a system or apparatus at real-life speed. Real-time simulators comprise elements that are typically based on computers or similar digital computing devices that compute the apparatus-governing-equations, which typically include a set of Differential-Algebraic Equations (DAEs). Practically, the system/apparatus may comprise 'controlled devices', meaning that they normally work in conjunction with a controller. The controller has the objective of effectively controlling the apparatus within certain objectives and requirements. In real life, the performance of the device (also known as the 'plant') is controlled by accepting the commands of the controller. The controller adjusts its commands by reading the device parameters/states (e.g., currents, position, speed). Expediently, the controller and controlled devices are connected in a closed-loop. The study of the behaviour of a controlled device and a controller connected in a closed-loop is a complex subject. Although basic PID (Proportional Integral Derivative) control can be studied using analytical methods, non-linear behaviour, fault modes and protection considerations add to the complexity so much that it becomes significantly difficult to validate a controller analytically.

By using a real-time simulator, engineers can test and validate the control laws of the controller in a safe environment, without risk of injuries, by replacing the real apparatus by a virtual one (especially in high power applications such as ships, planes, electric plants or grids). Simulators are often used also in cases where it is not even possible to use a real plant, for example to test protection limits in borderline conditions.

The real-time simulator itself generally comprises two main parts: a computing unit (—CPU, FPGA, GPU, or a combination of these—), running-models of a simulated apparatus and an input/output (I/O) interface. These I/Os connect the simulated controlled device to the controller under test. These I/Os are typically sets of analog inputs and outputs, and digital inputs and outputs. For example, the digital input will read the controller pulse that drives a switching converter (—power electronic converter—) simulated in the real-time simulator. Current and voltage values of the switching converter will be sent to the analog output of the simulator so that these values can be read by the controller. I/Os are required to close the loop between the real controller in the real world and the emulated controlled device. To synchronize the real-time simulator at real world time, the real-time simulator includes an internal clock, which can come from an I/O device or be generated by the operating system. It is also noted that the computing unit must be fast enough and/or use fast-enough algorithms to be able to compute and iterate the model states and outputs at the real-time pace. This is necessary to enable interaction with a real device connected to the I/O of the simulator.

Real-time simulation technologies are nowadays an integral part of the design and test process of many types of electric systems like large power grids, power converters and variable speed drives. These modern design approaches mitigate the risks through extensive use of technologies like Hardware-In-the-Loop (HIL) simulation and the model-based design approach. In HIL simulation, a plant controller is tested against a real-time simulated model of the plant. HIL simulation technologies enable more gradual integration, while diminishing the risk and costs of such projects. Also, in HIL simulation, more elaborate test coverage can be achieved than is possible using analog prototypes because of the safe operational limits of real power electronic devices and power plants.

Non real-time applications of real-time simulator.

FIG. 1, explained in more detail later, shows the real-time simulator usage in HIL with a controller under test. A real-time simulator can also be used without externally-connected controllers. This is the case in tests involving batch testing, and what is known as Monte-Carlo testing, with a large number of statistically varying test-cases. Note that Monte-Carlo tests can also be made in HIL mode. For example, this approach is used by utilities to correctly assess the protection of a power system. In this case, the same real-time solvers can be used, and the internal clock can be adjusted to suit the actual computation-time of the solver. Such usage of the simulator is sometimes viewed as being faster-than-real-time because in small power electronic systems it can result in simulation that is faster than in real-time. All applications of real-time simulators are therefore generally applicable to non-real-time simulators as well.

Human-in-the-Loop simulation

Real-time simulators are also often used to train operators with real-time simulated devices computed on the real-time simulator. This is generically similar to the configuration in FIG. 1 except that the 'controller' is a human person with I/Os adapted for human perception and actions. These I/Os may in this case be a graphical display, a keyboard, or a joystick, or the like.

Real-time simulation of switched power electronic systems

Real-time simulation of power converters is however very challenging for several reasons. The source of the challenge lies in the mandatory use of fixed-step solvers in a real-time simulator. Typical power converters are composed of a large number of switching devices operating at commutation frequencies that can be very high with regard to the sampling time of the real-time simulator. For example, it is not uncommon presently to commission power grid devices called FACTS devices with several hundred switches. These switches then create a large number of electrical modes that are difficult to compute using the class of real-time solvers. Second, the sampling time of the real-time simulator may be insufficient to correctly sample the PWM waveforms that often drive these converters. Additionally, many power converter configurations create instantaneous switching events that are hard to handle with non-iterative solvers. A good example of a converter that induces instantaneous events is the boost converter, wherein when the IGBT (Insulated Gate Bipolar Transistor) opens, the diode turns on immediately.

Finally, it is important to understand that these challenges are partly caused by speed limitations of the computational hardware available presently. In that regard, two main classes of hardware are used presently to design real-time simulation of power converter circuits: CPUs (as part of a computer system) and FPGAs. Each class of hardware has pros and cons. The structure of CPUs as well as derivative similar devices such as ARM (Advanced RISC Machines)

allows them to implement complex algorithms and solvers. Also, the use of high-level languages like 'C' for example, facilitates their implementation. However, the costs of conversion to machine-code (i.e. compilation), as well operating system and I/O bus latencies limit this approach to sample-times above 2-5 µs. On the other hand, this sample-time can go down to 5-10 nanoseconds in FPGAs (~1000 times lower than the sample-time in CPUs) but their internal structure limits the use of complex solvers and favors simpler ones.

For power systems and power electronic simulation and real-time simulation, the most common DAE (differential-algebraic equation) solver is the so-called 'Nodal Admittance Method' (NAM), sometimes referred to as the Dommel method. In NAM, the dynamic equations of elements such as resistances, inductances, capacitors, and other non-linear elements are made discrete with the trapezoidal rule of integration, which is an implicit integration method. The implicit integration method used creates discrete equations that cannot be iterated on their own as the current at time t, i[t], depends on the voltage at time t, v[t]. This problem is solved by combining all elements into a set of equations using the method of NAM. It is noted that the ratio of i[t]/v[t] is an admittance factor, and all elements must conform to the algebraic constraint (i.e. Kirchhoff voltage and current laws) created by their connections.

In NAM, switches are modeled as binary resistive switches: 'ON' if a switch is conducting, (it is modeled as a very small resistance or null resistance in some implementations) and 'OFF' if the switch is not conducting (it is modeled as a very high resistance or infinite resistance in some implementations) One of the main difficulties of implementing the NAM solver in real-time with these binary switches is that it requires a matrix re-factorization. Matrix re-factorization is a relatively computationally intensive operation that often limits the speed and size of real-time simulation in modern simulators. This re-factorization/inversion must be done each time the switching device toggles on and off in a simulation. Inversion must also be done if other non-linear devices change the operating point. NAM has variations like Augmented Nodal Admittance method and Modified Augmented Nodal Admittance (MANA) method. The original NAM however is most common in modern real-time simulators. The above NAM method originates from the well-known Kirchhoff electric circuit laws. The Kirchhoff current law states that the sum of currents entering a node must be zero. Similar laws exist in other domains. Hydraulic flows obey similar laws in pipe systems, and in aircraft hydraulic system simulation for example, the sum of flows at a given node must equal zero. This is to say that the nodal admittance method and the invention use principles that can be derived from other fields of engineering but they are mathematically analogous.

NAM solver without re-factorization: Pejovic solver

In what is known as a Pejovic solver, the NAM solver portion is modified to avoid re-factorization. The method models switching devices not as a binary switch as in conventional NAM, but as either a small capacitor when OFF and a small inductor when ON. If the following constraint is observed $$gs=C/h=h/L \quad (1)$$

with C being the capacitance in Farads used when the switch is OFF or non-conducting, L being the inductance in Henrys used when the switch is ON or conducting and 'h' being the simulation-time-step in seconds, then re-factorization is not required and the simulation speed is increased, which is especially advantageous for real-time simulators. The ratio C/h=h/L is also called the Pejovic conductance gs. This C/h=h/L ratio is valid for backward Euler discretization, and other discretization methods result in similar equality constraints. For example, discretization with the trapezoidal method results in the (2*C)/h=h/(2*L) equality constraint. This method is often called Fixed Admittance Matrix Nodal Method (FAMNM). The FAMN-Method is used in many real-time simulators like the Maguire simulator. However, FAMNM suffers from two well-identified problems:

1—The use of L/C components for switches notably induces spurious losses in the simulation.

This can be explained as follows: each time a capacitor or inductor disappears from the simulation, the energy contained in it also disappears. An inductor L with a current i in it contains an energy equal to $E=\frac{1}{2}Li^2$. A capacitor C with a voltage v across it contains an energy equal to $E=\frac{1}{2}Cv^2$. When the switching frequency increases, these spurious losses can become excessive. In this case, a simulated controlled device will exhibit higher power losses than its real life counterpart, and the real-time simulator becomes inaccurate.

2—The use of L/C components for switches induces spurious overvoltages and over-currents in the simulation.

This can be explained because when L-C components interact together in a circuit, oscillatory modes are created. The L/C components of the Pejovic method are known to add some oscillations at switching instants, much like when one energizes an L-C resonant circuit.

In an approach and method taught by Hui, the FAMN method is derived from the usage of so-called 'stublines' but the obtained method is basically the same as the Pejovic method resulting in a fixed nodal admittance method and with capacitive or inductive switches. The discrete equations of the switches in Hui are generally the same as in Pejovic, but only derived differently; therefore the present invention applies to both. Hui is cited as the basis of the RTDS FAMNM in Maguire wherein, the technique is clearly described as a fixed admittance matrix and with switches being an inductor or a capacitor.

Many of the prior art methods including methods taught in Maguire, Dufour and Razzaghi recognize the problem of over-voltage/current and/or power losses, and propose various methods to minimize the effects. Many other prior art methods focus on the optimization of the inaccuracies of the method and the decrease of the losses by choosing the best conductance value or gs value (gs=h/L=C/h). In Maguire specifically, the method tries to minimize overvoltage/over currents by using an RC circuit instead of C in the OFF state of the switch. Therein, the combined RC and L are adjusted to damp overvoltage/overcurrents only, but without affecting the power losses. In the Maguire paper, the OFF state of the switch is chosen to be an R-C circuit instead of a pure capacitor with the objective of reducing the Pejovic overvoltages/overcurrents, but the Maguire paper clearly mentions that the Pejovic Capacitor and Inductor energies are lost because of the use of FAMNM.

No prior art approach thus far has taught or used the method and apparatus of the present invention.

In some circumstances, the addition of a resistance to the OFF-state of the Pejovic switch can actually increase the losses. This can be explained considering that, to maintain a constant gs, one must increase the capacitor C to compensate for the increase in R (i.e. 1/gs=R+b/C). The increased capacitor value may just cause more losses because the maximum stored energy $\frac{1}{2}CV^2$ is greater than without R. The same remark goes for a possible but rarely used variation of the Pejovic method when the L 'ON' equivalent is replaced with an inductance and resistance in parallel.

Nevertheless, the present invention is also applicable to the foregoing R-C variation of the Pejovic method described in the arrangement taught in the Maguire method. In the Pejovic method, the choice of gs affects the accuracy of simulation because it changes the values of inductance and capacitance that are inserted and removed each time a switch turns ON or OFF. Much work has been done in the past to try to find an optimal value of this Pejovic conductance as in what is known as the Razzaghi method and also the Maguire type simulator with the RC model for the OFF state switch.

Calculation of FAMNM induced losses in a 3-phase 2-level inverter:
The FAMNM losses can be computed analytically from a simple inverter case. Take for example a 3-phase two-level inverter connected to a 3-phase load, as depicted in FIG. 1. Derived hereinafter is a formula to compute the switch losses in a typical FAMN Method for a 3-phase inverter outputting three-phase currents into a load from an ideal DC source, as illustrated in FIG. 2. that uses six controlled switches(—as explained later—).
The cause of the losses of the FAMN Method is that each time a switch changes state, it loses the energy associated with its L/C model. In the inverter, it is noted that:
Just before a switch is turned ON, it had the DC-link voltage applied to its terminals.
Each switch carries the load current before it is turned OFF.
Each switch is turned on and off $f_{pwm}$ times per second.
The following are defined:
$f_{pwm}$: PWM frequency of the drive
$f_{load}$: Frequency of the currents
$I_{eff}$: Load current (RMS value)
$V_{dc}$: DC voltage being inverted
Considering that the 6 switches all have the same voltage V before they are turned on, the turn-on loss is then:

$$P_{on}=6*0.5*C*V_{dc}^2*f_{pwm} \text{ Watts} \quad (2)$$

The switches also cut off the load current which has a $f_{load}$ frequency. Consider hypothetically that the PWM frequency is an exact multiple of the load frequency $K=f_{pwm}/f_{load}$
The turn off power is then:

$$P_{off} = 6*0.5*L*f_{pwm}\sum_{k=0}^{K-1} \sqrt{2}\, I_{eff}\cos^2(2\pi k/K) \quad (3)$$

which can be reduced to $$E_{off}=6*0.5*L*f_{pwm}*I_{eff}^2 \quad (4)$$

The total loss is then equal to:

$$P_{tot}=3*f_{pwm}*\{C*V_{dc}^2+L*I_{eff}^2\} \quad (5a)$$

or $$P_{tot}=3*f_{pwm}*h*\{g*V_{dc}^2+1/g*I_{eff}^2\} \quad (5b)$$

with h being the time step and gs being the {L,C} discrete admittance value of the FAMNM switch using the Backward Euler method. A similar formula can be obtained for the Trapezoidal Rule of integration.

From Eq. 5a, it is seen that a minimum loss can be realized by choosing gs correctly. A similar observation is also made in Maguire in the Maguire-publication. It is noted in this context that the problem of FAMNM losses is well-known in literature.

The losses discussed supra are induced by the FAMN Method and are eliminated or reduced by the present invention.

SUMMARY OF THE INVENTION

This invention is directed to the spurious power losses and oscillations caused by the FAMNM solver inside a real-time/non-real-time simulator. According to the present invention, these losses can be minimized/avoided by analyzing the topology of the switching devices and correctly initializing the switches when they change the conduction state. By transferring the L/C energies across elements that change ON/OFF states simultaneously, it is possible to limit, or even completely eliminate the power converter losses as well as the over-voltages and over-currents. In a more general way, cross-initialization, i.e., initializing the L/C switching elements to the final state of current and voltage that would occur if the circuit were allowed to reach its post-transient steady-state, will result in a transient-free FAMNM simulation. In both ways, i.e., either by viewing the problem from an energy transfer point of view, or a simple steady-state initialization point of view, correct initialization can preferably be determined from pre-stored tables of events and the system current-states at the time of the cross-initialization. Correct initialization can also be determined without pre-stored tables of events if the computational power is high enough to detect these events during simulation. However, as described hereinafter in the exemplary embodiments, the current implementation makes use of pre-stored tables of events.

Known methods of designing the FAMNM simulator, as aforesaid, recognize the problem of over-voltage/current and/or power losses and propose various solutions to minimize the effects. The main focus of the prior art approach to address known issues is the optimizing the inaccuracies in the method and decreasing the losses by choosing the best Pejovic conductance value gs (gs=h/L=C/h for Backward Euler). In the Maguire method, the approach is to minimize state overshoots by using an RC circuit instead of C in the OFF state of the switch and it does not actually show the impact on power losses. None of the prior art methods or known methods is believed to use the present inventive concept of cross-initialization. The invention in its broad form resides in method and apparatus/system as explained hereinafter.

In one form, the invention resides in a method for operating a simulator, in the context of a fixed admittance matrix nodal (FAMN) inversion-free solver in a real time simulator for a power electronic motor drive or similar load that uses a controlled switching circuit with FAMNM switching devices which are fed by a DC or AC power source. The method of the invention is directed to reducing spurious losses and oscillations/spikes inside the simulator; the method comprises the iteration steps of: choosing a time interval T final; modelling each of the switching devices as a capacitor C when "off" and an inductor element L when 'on', each switching device L and switching device C being subjected to controlled switching of their conduction state; and, initializing the L/C switching devices when they change their conduction state to a final state of current and voltage which would occur if the switching devices were left to reach their final state in each sampling cycle. These initialization values of the switching devices could equivalently be determined by initializing the L/C elements as if the element were replaced by binary resistive switches.

The invention in another form resides in a simulator for a power electronic circuit such as a variable speed drive motor using controlled switching devices in an inverter or power electronic converter that is fed by a DC or AC power source, the simulator being of the type using a fixed admittance matrix nodal method (FAMNM) inversion-free solver wherein a controlled switching device that is 'off' is featured as a capacitor C and wherein a controlled switching device that is 'on' is featured as an inductor L; in this form of the invention, the controlled switches are arranged to operate in switch-pairs, each of said pairs including a designated upper switch and a designated lower switch, wherein each said upper switch and each said lower switch toggles conduction states between 'on' and 'off'; this converter topology is often called a two-level inverter (2LI) in known literature; the simulator of this embodiment comprises means for causing cross-initialization of the upper and lower switches in each pair prior to each toggle, said means being connected to:

(1) initialize a new C voltage that appear at an upper switch position with a voltage of its corresponding lower switch in each said switch pair; and
(2) initialize a new L current that appears at a lower switch position with an L current of its corresponding upper switch in each said switch pair, thereby minimizing spurious losses and oscillations/spikes in the simulation.

The initialization steps (1) and (2) can also be equivalently computed from the DC (or AC) input voltage and the load current values at the time of the switch-toggle that induces a cross-initialization event.

The simulator apparatus may be a real-time simulator, and may include a CPU as part of the means for causing cross-initialization and for also reading stored tables to enable performing cross-initialization. Alternatively, the means for causing cross-initialization comprises a field-programmable-gate-array (FPGA). In one embodiment, the controlled switching devices which are simulated comprise insulated gate bipolar transistors (IGBT)s. The real time simulator may simulate a two level inverter (2LI), wherein further each controlled switching device may include devices chosen from the group consisting of GTO, MOS-FET, Diodes, Thyristors, and Insulated Gate Commutated Thyristors. The simulated inverters may be joined to form an H-bridge inverter which is basically composed of a two 2LI converter pair. The pair can also be made of different switch types, like IGBTs and diodes, commonly used to make buck, boost, buck-boost and cuk converters, for example.

In another form, the invention resides in a simulator simulating a 3-level neutral point clamped inverter (3LN-PCI) that is fed by a DC power source to supply a power electronic system/load such as a variable speed drive motor, said inverter using controlled switching devices S1, S2, S3, S4 and two diodes S5 and S6, said simulator being of the type using a fixed admittance matrix nodal method (FAMNM) inversion-free solver wherein a controlled switching device that is 'off' is featured as a capacitor C and wherein a controlled switching device that is 'on' is featured as an inductor L, further wherein said controlled switches operate in a physically coherent cycle of switching transitions, wherein said controlled switches toggle conduction states between 'on' and 'off', and wherein specific transitions in said devices S1-S4 occur and are detected and listed in a preset cross-initialization table, the simulator including programmed computer means for causing cross-initialization of the switching devices S1-S4 prior to each toggle, using information in the preset cross-initialization table, thereby to minimize spurious losses and oscillations/spikes in the simulation.

The invention is applicable to any power electronic converter or inverter. It is noted that 2LI and 3LNPC are types of converters commonly known as AC-DC converters or AC-DC inverters, with the words 'inverter' and 'converter' being interchangeable for purposes of this invention. Other AC-DC converters include flying-capacitor converters. There also exist other types of power electronic converters such as AC-AC matrix converters, and line-commutated converters, which include cyclo-converters and thyristor converters. DC-DC converters are also are within the purview of this invention, comprising but not limited to the well-known buck, boost, buck-boost, and cuk topologies. All of the above including cascaded-H-bridge converters, can be simulated by FAMNM method, and the invention can therefore apply to those scenarios as well.

BRIEF DESCRIPTION OF THE DRAWINGS

A more detailed understanding of the invention may be had from the following description of preferred embodiments given by way of example only and not intended as limiting, to be read and understood in conjunction with the accompanying drawings wherein.

DETAILED DESCRIPTION OF PREFERRED EMBODIMENTS

A detailed description of one or more embodiments of the invention is provided below in the context of the accompanying figures that illustrate by way of example the principles of the invention. While the invention is described in connection with such embodiments, it should be understood that the invention is not limited to any particular embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

Figure 1:
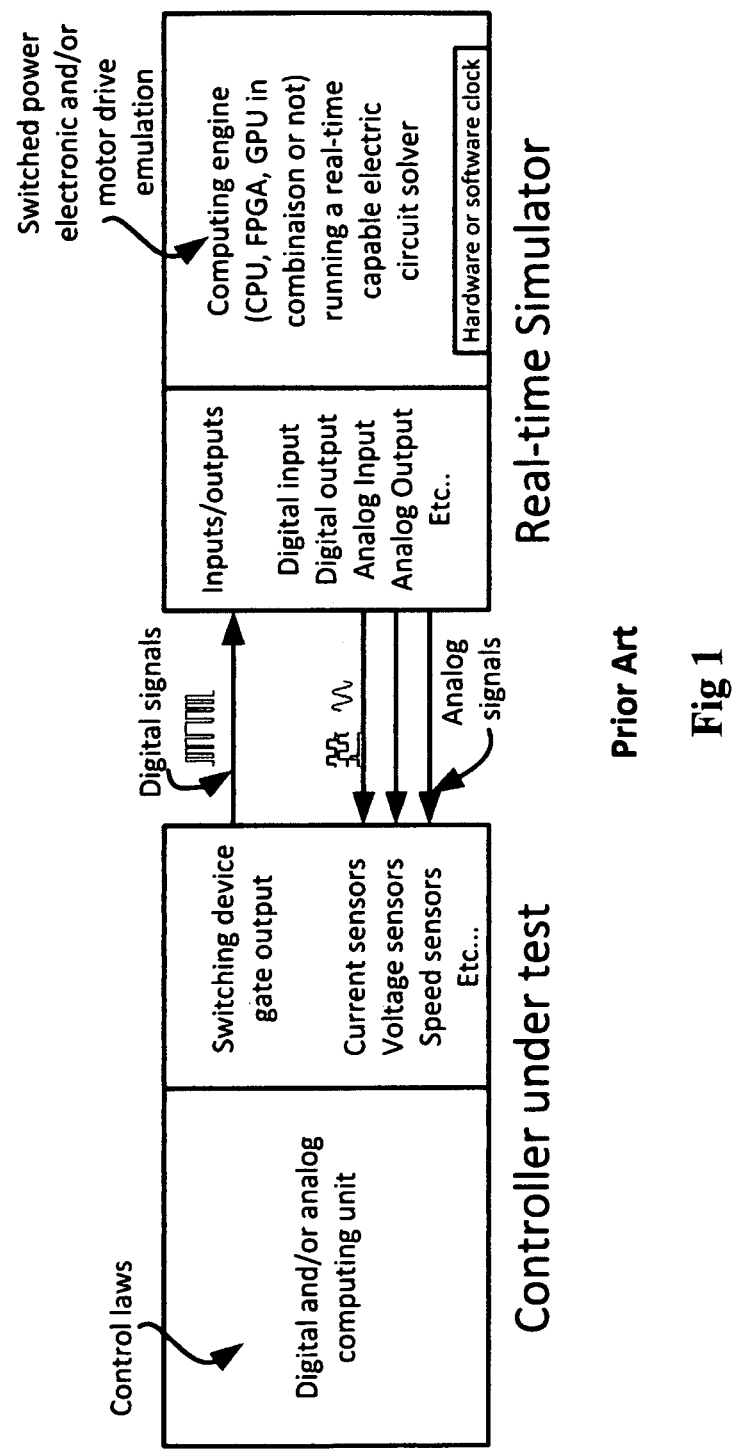
FIG. 1 shows a real-time simulator connected to a controller under test.
Figure 2:
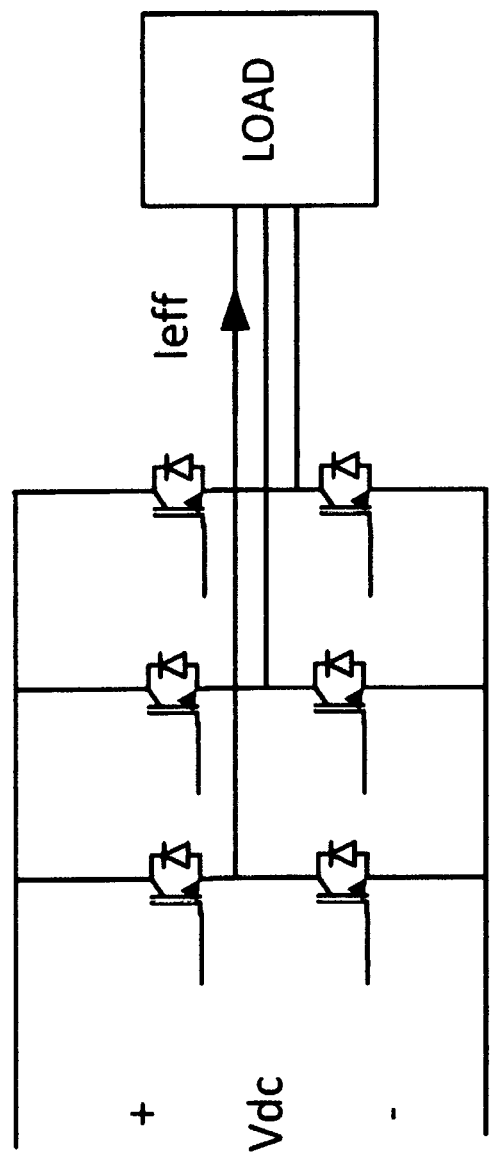
FIG. 2 shows a 3-phase 2-level inverter (2LI) connected to a load.
Figure 3:
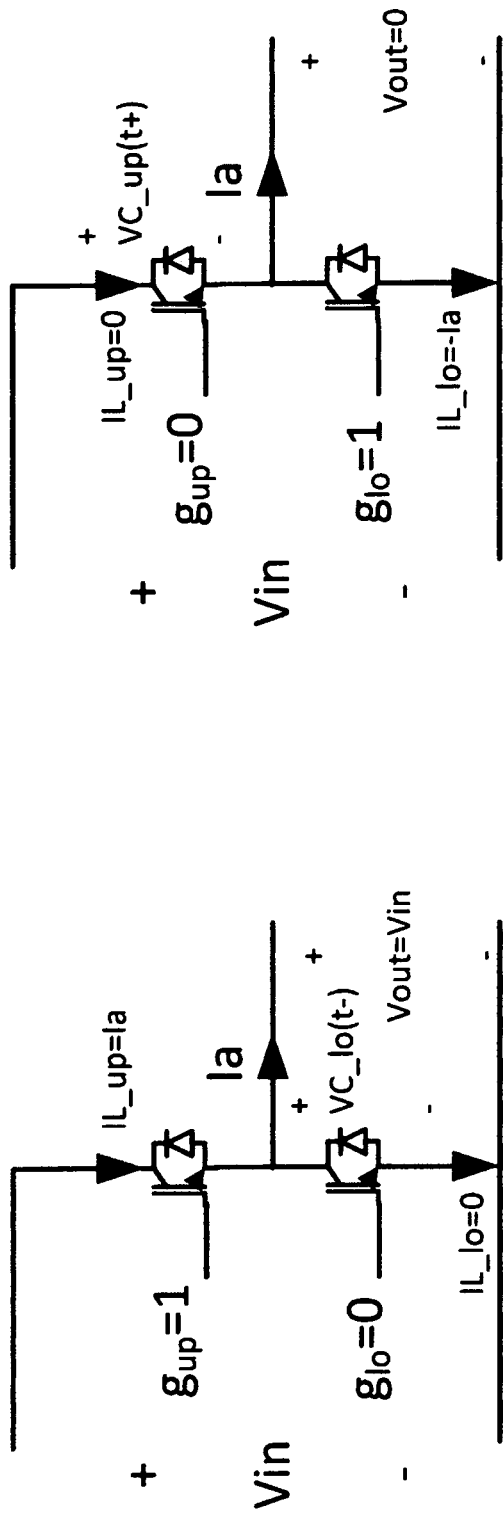
FIG. 3 shows the relation between load voltage and current in active mode in an IGBT in a 2-level inverter leg.

The present invention may be practiced according to the claims without some or all of these specific details. For purposes of clarity, technical material that is known in the technical fields related to the invention has not been described in detail so that the present invention is not unnecessarily obscured. FIG. 1 shows a real-time simulator connected to a controller under test, and is considered prior art; FIG. 2 shows a 3-phase 2-level inverter (3 phase LI) connected to a load; and FIG. 3 illustrates the relation between load voltage and current in active mode in an IGBT in a 2-level inverter leg.

Figure 4:
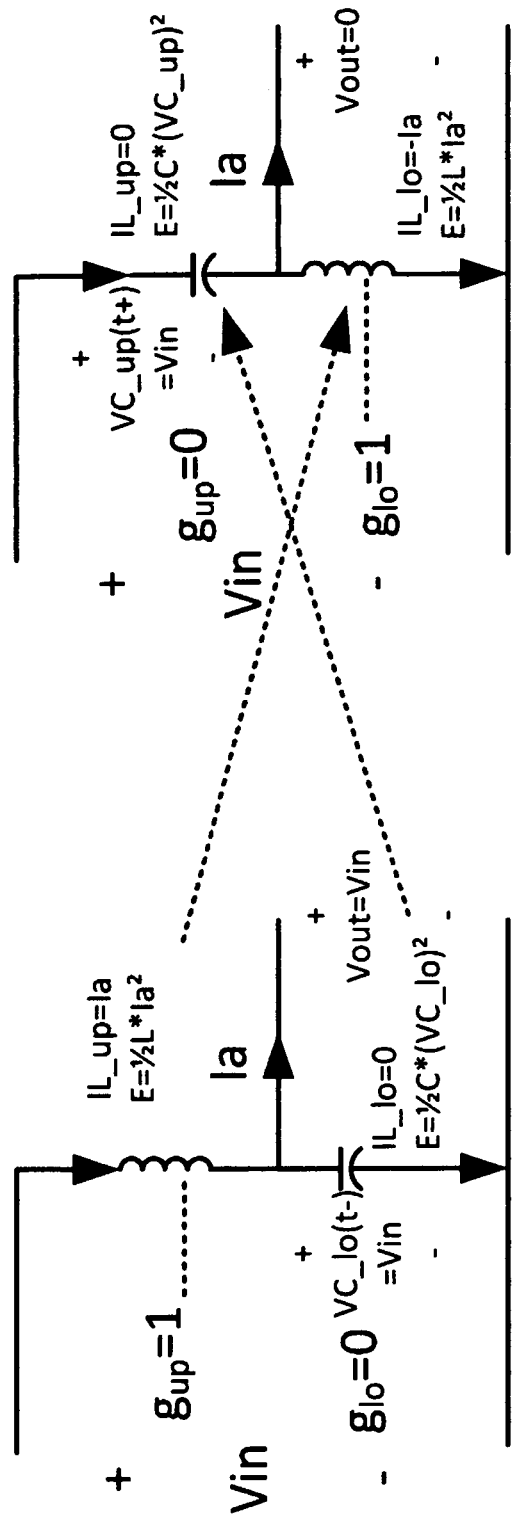
FIG. 4 illustrates the L/C equivalent of the 2-level inverter.

An exemplary implementation of this invention is explained next with reference to FIG. 2 as an example for the 3 phase 2-level inverter (2 LI). In the active mode of the 2LI (mode where PWM pulses are applied to the inverter and the inverter imposes a PWM type voltage to the load), there is always one IGBT/Diode switch that is ON and the other IGBT/Diode switch is OFF (for each pair in each phase). The 2LI is designed in this manner to avoid sudden discontinuities of the load current, considering that the discontinuity would induce significant over-voltage and possibly damage the inverter. By replacing the switches by their FAMNM equivalent (inductance L when the switching device is ON and capacitance C when the switching device is OFF), the states illustrated in FIG. 4 are achieved.

In the standard FAMNM, each time a switch toggles between ON/OFF states, the corresponding inductor (L) and capacitor (C) are typically initialized with null current and voltage. This is the normally true because the L/C components seem to 'appear' and 'disappear' from the simulation. This impacts the simulation accuracy in the following two ways:

(1) There is a sudden discrepancy between the load current and the ON switch current and also a discrepancy between the load voltage and the OFF switch voltage. This discrepancy creates a current-transient in which the ON switch inductance goes from 0 to the load current. The discrepancy also creates a voltage-transient on the OFF switch capacitor where the voltage goes from 0 to Vin.

(2) There is an instantaneous energy loss when each switch toggles the L/C states because the stored energy of inductor ($E=\frac{1}{2}Li^2$) and capacitor ($E=\frac{1}{2}Cv^2$) is lost at each transition.

Next, from the illustration in FIG. 4, it is seen that by initializing the inductance L and capacitance C correctly when the switches toggle between their ON and OFF states, the energy is kept without losses. This also avoids current and voltage transients because the switches are initialized with their final current and voltage.

The initialization is made across the pair of switches in the following manner as an example:

Just before toggling of the switch pair, the upper switch conducts with a current IL_up(t−) and the lower switch is open with a voltage VC_lo(t−) across it. When the switches toggle states, their L/C equivalents also toggle. The 'cross-initialization technique that is at the core of this invention works to initialize the 'new' FAMNM capacitor voltage VC_up(t+) that appears at the upper switch position with the voltage of the lower switch before toggling VC_lo(t−); this further initializes the 'new' FAMNM inductance current IL_lo(t+) that appears at the lower switch position with the current −IL_up(t−) of the upper switch inductance before toggling. (It is noted that the minus sign in −IL_up(t−) is just a question of definition of current polarity). Alternatively and equivalently, the initialization values VC_up(t+), VC_lo(t+), IL_up(t+), IL_lo(t+) can also be found from the inverter value Vin(t−) and Ia(t−).

This above manner of cross-initialization is believed to be inventive and herein is called 'cross-initialization'.

All cross-initialization events, such as the one just described, are entered inside an 'initialization table' that will be used during the FAMNM with cross-initialization algorithm execution. This table may be customized for a given converter topology. In the case of the 2-level inverter previously described, the table looks like the following ones, with the triggering conditions listed in Table 1-A and state initialization actions in Table 1-B.

TABLE 1-A 2-level inverter event trigger case table/initialization table

Triggering condition:

| Trigger Case # | Upper IGBT gate | Lower IGBT gate | Output current Ia |
| --- | --- | --- | --- |
| 1 | Rising edge | 0 | >0 |
| 2 | Falling edge | 0 | >0 |
| 3 | 0 | Rising edge | <0 |
| 4 | 0 | Falling edge | <0 |
| 5 | 0 | 0 | Zero crossing |
| 6 | Rising edge | 0 | =0 (both switches are initially non conducting) |
| 7 | 0 | Rising edge | =0 (both switches are initially non conducting) |

TABLE 1-B

| | Trigger cases #: | |
| --- | --- | --- |
| | 2, 3 | 1, 4 |
| Explanation | Upper switching device turning OFF | Upper switching device turning ON |

TABLE 1-B-continued

|  | Lower switching device turning ON | Lower switching device turning OFF |
|---|---|---|
| Action 1 | IL_lo(t+) = −IL_up(t−) or equivalently IL_lo(t+) = −Ia(t−) | IL_up(t+) = −IL_lo(t−) or equivalently IL_up(t+) = Ia(t−) |
| Action 2 | Vc_up(t+) = Vc_lo(t+) or equivalently Vc_up(t+) = Vin(t−) | Vc_lo(t+) = Vc_up(t+) or equivalently Vc_lo(t+) = Vin(t−) |

| | Trigger cases #: | | |
|---|---|---|---|
| | 5 | 6 | 7 |
| Explanation | Both switches are turning OFF | Upper switch is turning ON from the state where both switches are OFF | Lower switch is turning ON from the state where both switches are OFF |
| Action 1 | Vc_up(t+) = Vin(t−)/2 | Vc_lo(t+) = Vin(t−) | Vc_up(t+) = Vin(t−) |
| Action 2 | Vc_lo(t+) = Vin(t−)/2 | IL_up(t+) = Ia(t−) = 0 | IL_lo(t+) = −Ia(t−) = 0 |

Figure 5:
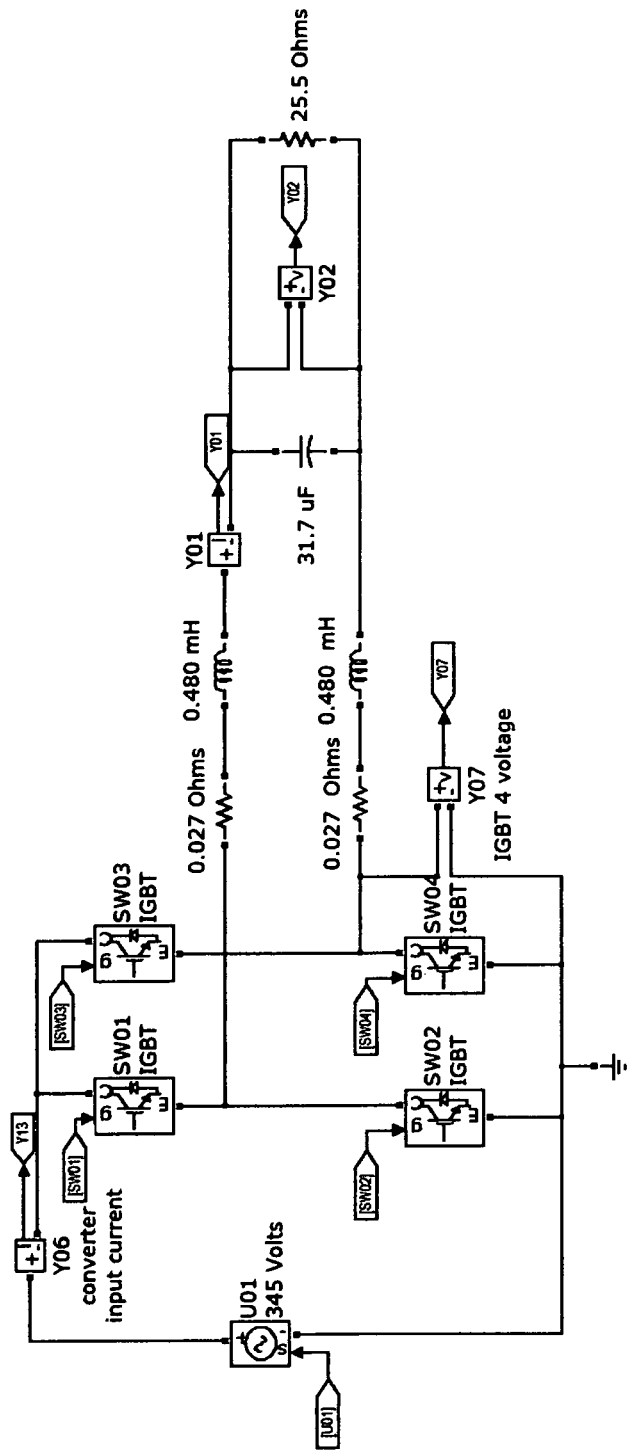
FIG. 5 illustrates an H-bridge model ready for use in Opal-RT eHS simulation tool.

Demonstration of the cross-initialization effect on the voltage and current overshoots using the present invention:

In FIG. 5, an H-bridge inverter, composed of 2 LI, each leg of the 2LI comprising 2-IGBT/diode switching devices is depicted. FIG. 5 illustrates a SimPowerSystems® (SPS) blockset, which is a commonly used simulation tool for power systems and power electronic simulation. This SPS drawing is used for example to generate the netlist used for Opal-RT 'Electric Hardware Solver' (eHS), which is a commercial simulation solver based on the FAMN Method and implemented on FPGAs. The Opal-RT solver eHS takes the 'netlist' of this model and makes the simulation thereof using the FAMN Method.

Exemplary values of the different components are shown in FIG. 5. The time step chosen for example is 215 nanoseconds which allows simulation of the FPGA computational engine of eHS and the Pejovic conductance gs=0.0325. The H-bridge IGBTs are driven by 50 kHz PWM.

The effect of using cross-initialization on the circuit of FIG. 5 is to be noted. FIG. 5 illustrates the effects of cross-initialization on the output voltage (voltage sensor named 'Y07 IGBT4 voltage' in the model) and the input current (current sensor named 'Y06 converter input current' in the model).

Figure 6:
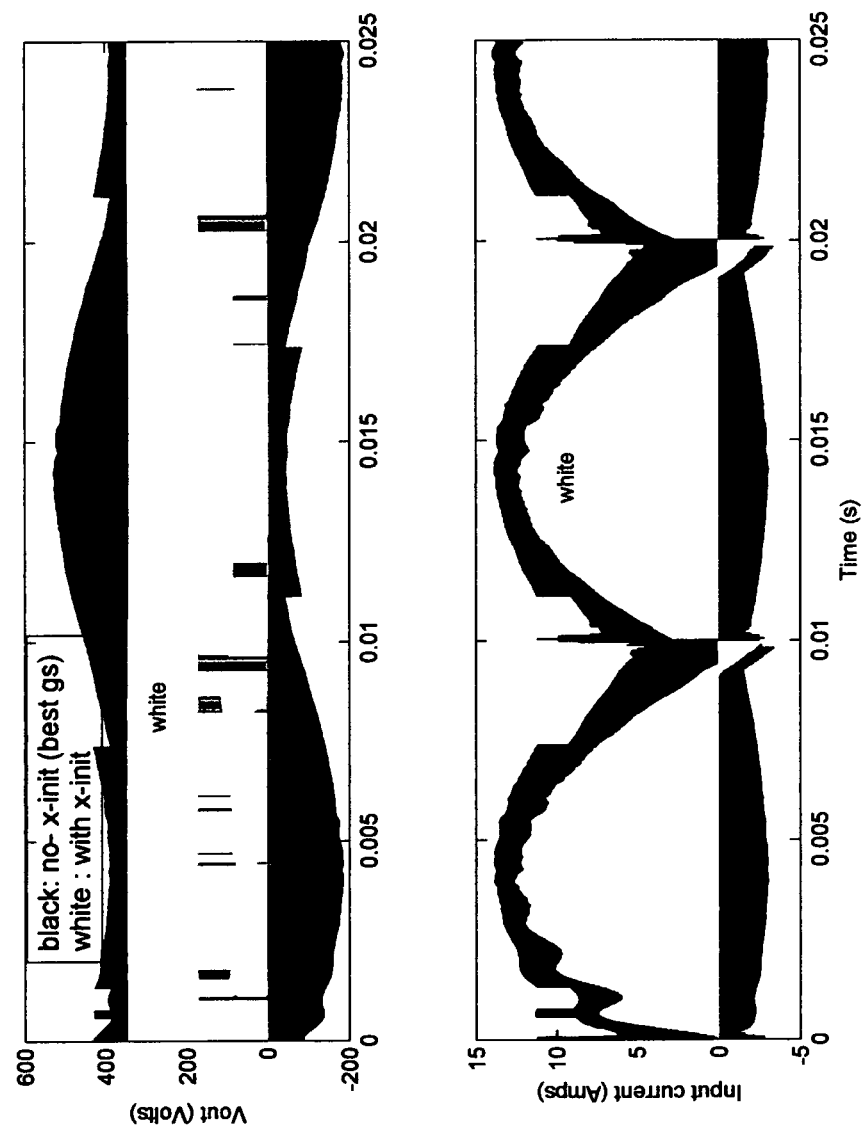
FIG. 6 illustrates top 'Y07 IGBT-4' voltage, bottom 'Y06 converter input' current showing the difference with and without cross-initialization.
Figure 7:
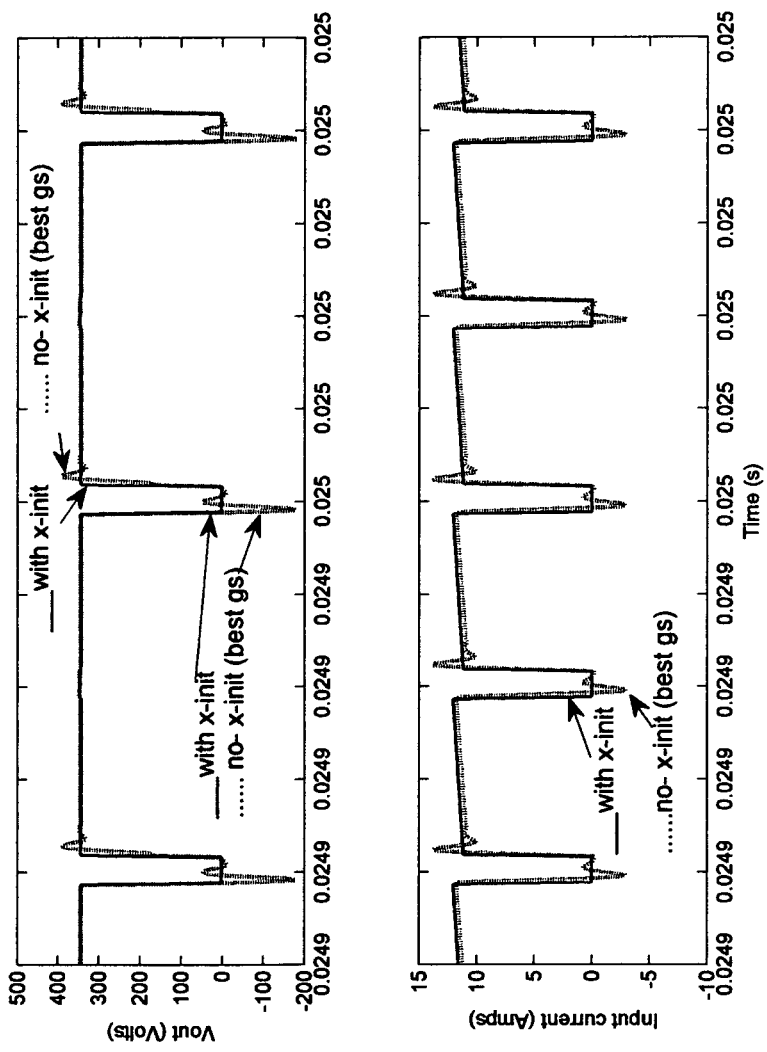
FIG. 7 illustrates the zoom of previous FIG. 6 showing the top 'Y07 IGBT-4' voltage, bottom 'Y06 converter input' current, noting the difference with and without cross-initialization.

FIG. 6 and FIG. 7 show the simulation results respectively with and without cross-initialization. FIG. 7 is a zoom-illustration of FIG. 6. In the zoomed figure, one can observe the well-known oscillations of the FAMN Method on the output voltages and input currents. But when the cross-initialization method is enabled, these oscillations disappear and the curves are identical to standard simulation using non-FAMN Methods. The ideal simulation result is easy to see for the voltage output: it can only be 0 or 345V (the value of the voltage source of the inverter). This is exactly what is produced by the calculation method of the invention.

Power losses are minimized with cross-initialization also in the above case. These power losses are computed by averaging the integrated power dissipated at the 25.5 Ohms load and comparing it with the power delivered by the source. The difference is dissipated between the two and is the power loss. Part of this power loss is due to the 0.027 Ohms resistance in the link, while the remaining loss is as induced by the Pejovic simulation method.

With the cross-initialization, this power loss is equal to 58 Watts (average power for 1 second of simulation) while without the cross-initialization, this power loss is equal to 108 Watts.

For this test, the best gs value in terms of power losses for the case without cross-initialization was used. Other gs values will modify either the spurious oscillations or increase the total losses. The gs value does not have any significant effect when used with the present cross-initialization method.

Application of cross-initialization to other power converter topologies:

The cross-initialization technique can be applied to other inverter topologies. The 3-level NPC inverter (3LNPCI), composed of 4 IGBT/diode pairs and 2 diodes is a good example for applying the cross-initialization technique. In the case of 3LNPCI, the principles of the present invention are similarly applied but slightly extended. For example, there can be multiple simultaneous cross-initialization events. It is also possible that initial conditions will map from one switching device to multiple switching devices. For example, a single OFF-switch initial-voltage at t− could be applied to 2 switches at t+, t− and t+ being the time of the switching event, just before (t−) and just after (t+) the event. If the 2 switches are in series, then the cross-initialization voltage is divided into 2 and applied to both switches.

Each power converter/inverter circuit topology is designed to be controlled with a prescribed pattern of switches turning on and off. This means that the normal switching pattern of these devices is coherent with their design. Also, in real 3LNPCI and 2LI converters and in other voltage inverter topologies in general, the design is made to conform to two constraints:

1—Disallow a current discontinuity at the load. If the current path to the load would be suddenly opened from a non-null current, the L*di/dt voltage that could develop would damage the switching devices. Thus there will always be a path from the load to the DC or AC bus; and, 2—Controlled in a way that that forbids DC-link and AC-bus short circuits.

Analysis of the switching behavior of the 3LNPCI leads to the proper cross-initialization event table. It results in a transition table that will detect all possible and realistic power converter switching-device-transitions and re-initialize the initial conditions among the L/C switches of the converter.

Figure 8:
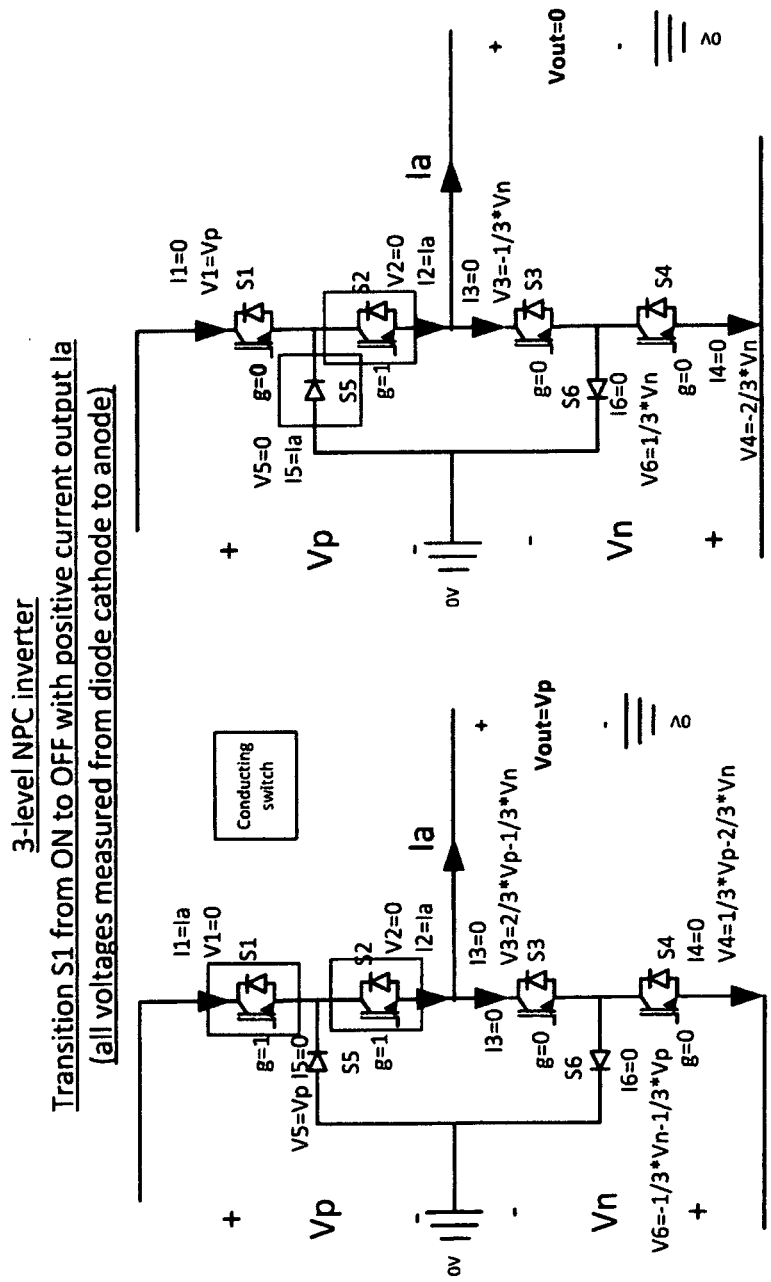
FIG. 8 illustrates an example of a cross-initialization event for a 3-Level Neutral Point Clamped Inerter (left, before event and right, after event;)

FIG. 8 illustrates one leg of a 3LNPCI, containing 4 IGBT/Diode pairs and 2 diodes. The basic objective of this topology is to apply 3 different voltages (referred to the lower side of S4) to the load: Vp, Vn or 0. Also note the symmetry of design: for each voltage applied to the load, 2 and only 2 switches with IGBTs conduct at the same time. Consequently, in this case, multiple cross-initializations can be made on more than two switches.

FIG. 8 assists in the study of one switching transition of the 3LNPC. FIG. 8a shows the scenario before the 'event' and, FIG. 8b shows the scenario after the 'event'. This transition occurs when the gate of S1 goes down when S1 and S2 are conducting with positive current. This causes S1 to immediately turn OFF and S5 to turn ON. The following is noted:
1) Positive load current, S1 and S2 are ON. Iout is positive
2) Event: S1 going from ON to OFF by setting the S1 gate OFF (g=0)
3) This causes S5 to go from OFF to ON instantaneously.

In the FAMN Method, S1 goes from an inductor to a capacitor and S5 goes from a capacitor to an inductor. In this transition, the cross-initialization between the L/C elements is made in the following way for example:
a—S5 equivalent inductance initial current at t+ is set equal to the current of S1 at t−.
b—S1 equivalent capacitance initial voltage at t+ is set equal to the voltage of D5 at t−.
c—S4 capacitor voltage is changed to −⅔*Vn
d—S6 capacitor voltage is changed to ⅓*Vn
e—S3 capacitor voltage is changed to −⅓*Vn These various initial transfer conditions at cross-initialization events can be easily found by Kirchhoff voltage law of the power converter. What is needed is to look for the final state of the equivalent L/C FANMN components. Considering that in DC an inductance L acts as a short-circuit and a capacitor C acts as an open-circuit, the initial conditions can be found by solving the nodal admittance system equation:

$$\begin{bmatrix} \frac{1}{R1}+\frac{1}{R2}+\frac{1}{R5} & -\frac{1}{R2} & 0 \\ -\frac{1}{R2} & \frac{1}{R2}+\frac{1}{R3} & -\frac{1}{R3} \\ 0 & -\frac{1}{R3} & \frac{1}{R3}+\frac{1}{R4}+\frac{1}{R6} \end{bmatrix} \begin{bmatrix} V1 \\ V2 \\ V3 \end{bmatrix} = \begin{bmatrix} \frac{Vp}{R1} \\ -Ia \\ \frac{Vn}{R4} \end{bmatrix} \quad (6)$$

with R1, R2, R3, R4, R5 and R6 being the 3LNPCI switch resistance values. Substituting a very small resistance for inductance (ON switches) and a high-resistance for the OFF switches, one can find all t+ OFF switch state values from the switch status, the load current direction and the converter source voltages. The t+ON switch state will usually be the load current Ia but could also be determined from Eq. 6.

Equation 6 also shows that if the R-C 'off' state switch equivalent is used instead of the standard C in the FAMNM, the computed initial conditions computed for the cross-initialization table remain similar.

This method of finding the initial conditions of the FAMNM switches for the cross-initialization table is in itself a method to obtain the final state of current and voltage of the switches which would occur if said switching devices were left in their final state in each sampling cycle, as expressed in the claims. Other methods exist to compute these values of final states, and are within the ambit of the invention.

Many different switching events are possible in the 3LNPVI; all active mode switching events must be taken into account, put into the cross-initialization table that will link all events to proper cross-initialization actions. It is also possible to include natural events in the table, such as, for example, when a diode turns-off simply because its current becoming negative. Other events can also only reconfigure the status of various switches without causing a change in the output voltage or input current. They can be taken into account by the table of cross-initialization events if desired but their effect is less important than the output-changing events.

The following tables 2A and 2B give the list of cross-initialization events for a typical usage of the 3LNPC inverter. Other events may exist depending on the usage.

TABLE 2-A 3-level inverter event trigger case table

| Trigger Case # | Status t− | | | | | | Current Ia | Action at t+ |
| | S1 | S2 | S3 | S4 | S5 | S6 | | |
| --- | --- | --- | --- | --- | --- | --- | --- | --- |
| 1 | 0 | 1 | 0 | 0 | 1 | 0 | >0 | IGBT 1 Gate↗ |
| 2 | 1 | 1 | 0 | 0 | 0 | 0 | >0 | IGBT 1 Gate↘ |
| 3 | 1 | 1 | 0 | 0 | 0 | 0 | <0 | IGBT 3 Gate↗ |
| 4 | 0 | 0 | 1 | 0 | 0 | 1 | <0 | IGBT 3 Gate↘ |
| 5 | 0 | 0 | 1 | 1 | 0 | 0 | >0 | IGBT 2 Gate↗ |
| 6 | 0 | 1 | 0 | 0 | 1 | 0 | >0 | IGBT 2 Gate↘ |
| 7 | 0 | 0 | 1 | 0 | 0 | 1 | <0 | IGBT 4 Gate↗ |
| 8 | 0 | 0 | 1 | 1 | 0 | 0 | <0 | IGBT 4 Gate↘ |

TABLE 2-B

| | Trigger cases #: | | | |
| | 1, 4 | 6, 7 | 2, 5, | 3, 8 |
| --- | --- | --- | --- | --- |
| Explanation | Vout→V+ | Vout→V− | Vout→0 (by S2-S5) | Vout→0 (by S3-S6) |
| Initialization at t+ | I_S1 = Ia<br>I_S2 = Ia<br>V_S3 = ⅔ * Vp + ⅓ * Vn<br>V_S4 = ⅓ * Vp − ⅔ * Vn<br>V_S5 = Vp<br>V_S6 = ⅓ * Vp + ⅓ * Vn | V_S1 = ⅔ * Vp − ⅓ * Vn<br>V_S2 = ⅓ * Vp − ⅔ * Vn<br>I_S3 = −Ia<br>I_S4 = −Ia<br>V_S5 = ⅓ * Vp + ⅓ * Vn<br>V_S6 = Vn | V_S1 = Vp<br>I_S2 = Ia<br>V_S3 = −⅓ * Vn<br>V_S4 = −⅔ * Vn<br>I_S5 = Ia<br>V_S6 = ⅓ * Vn | V_S1 = ⅔ * Vp<br>V_S2 = ⅓ * Vp<br>I_S3 = −Ia<br>V_S4 = Vn<br>V_S5 = ⅓ * Vp<br>I_S6 = Ia |

Simulations were made on a model with the 3LNPC inverter as shown in FIG. 8 to compare the standard FAMNM and FAMNM with the inventive cross-initialization. For the simulations, Vp=100V, Vn=100V, a PWM frequency of 1000 Hz with a fundamental frequency of modulation is 60 Hz and load current is a triangular waveform of ±50 A with 0.7 millisecond period. The Pejovic conductance was set to 0.1 mhos. The simulation time step was set to 300 nanoseconds as an example of a typical FPGA time-step.

Figure 9:
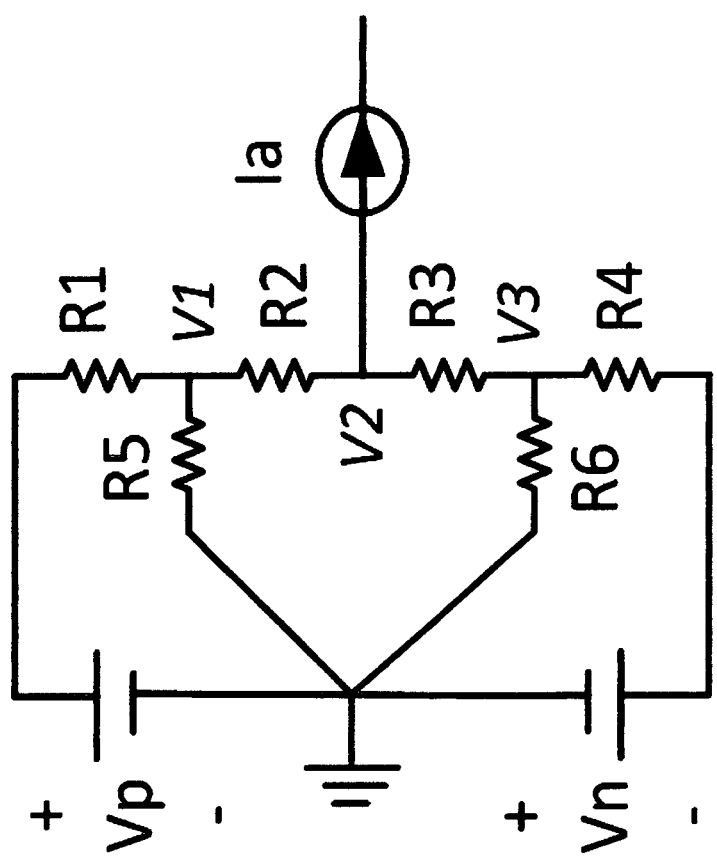
FIG. 9 shows a resistive equivalent circuit of the 3LNPC inverter used to determine cross-initialization voltages and currents.

FIG. 9 shows a resistive equivalent circuit of the 3LNPC inverter used to determine cross-initialization voltages and currents; as shown, the supply source is DC. However an AC supply source is within the purview of this invention.

Figure 10:
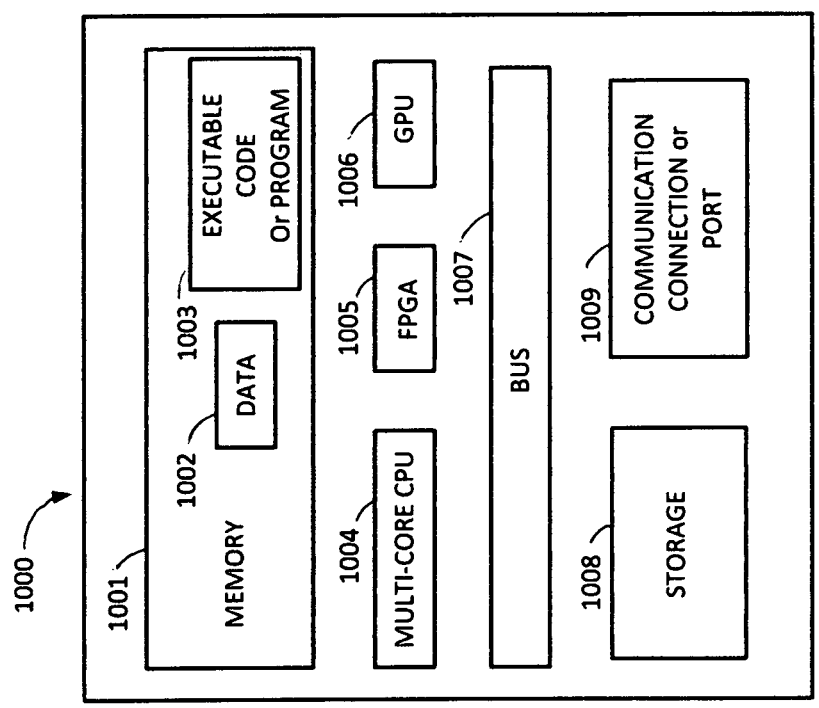
FIG. 10 illustrates a general purpose computer that is programmed to assist timely initiation of the controlled switches in a power electronic converter, using information/events from or without events stored in a table.
Figure 11:
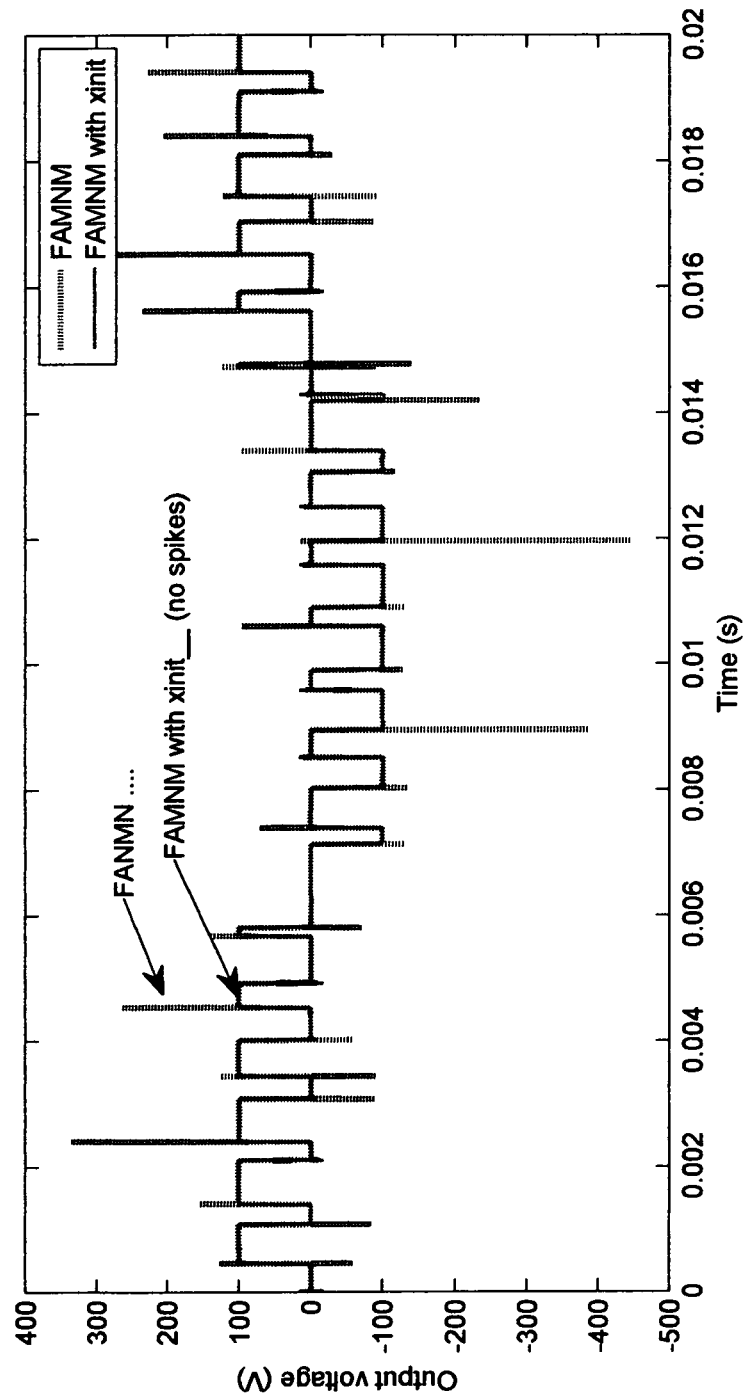
FIG. 11 shows the voltage output of the 3-level inverter, illustrating comparison of FAMNM with and without cross-initialization (xinit)
Figure 12:
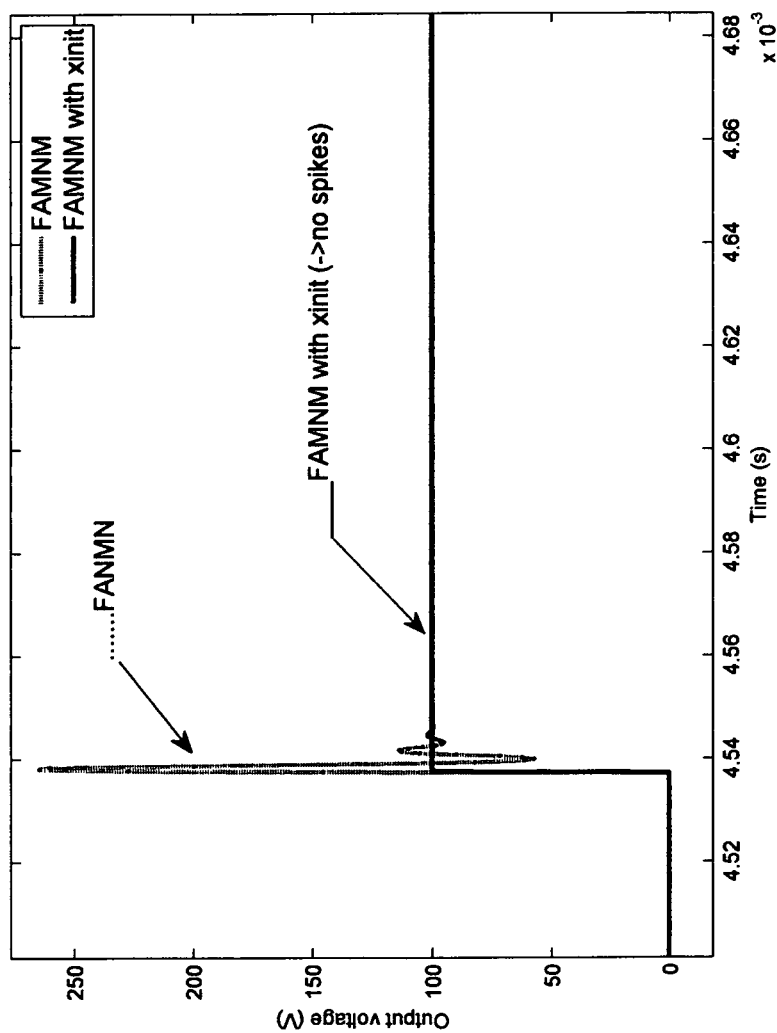
FIG. 12 shows the zoom of voltage output of the 3-level inverter, illustrating comparison of FAMNM with and without cross-initialization (xinit)
Figure 13:
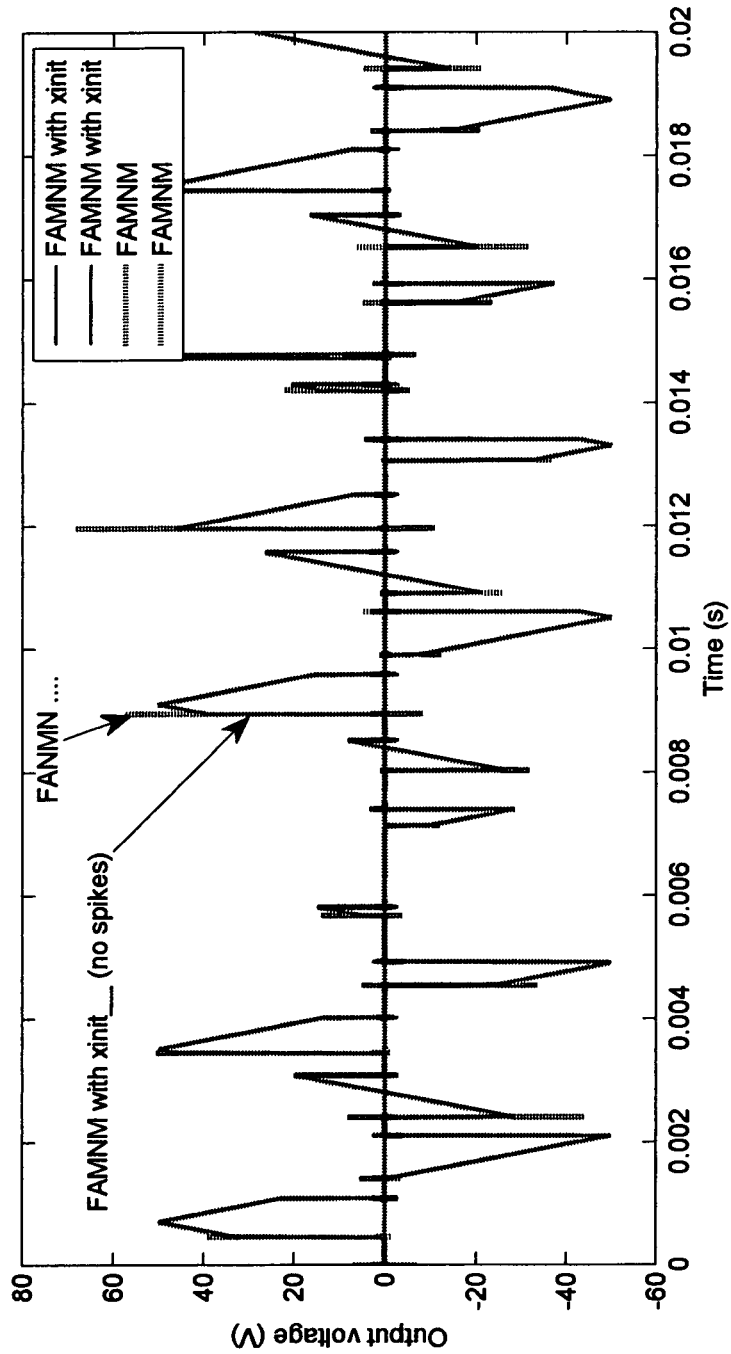
FIG. 13 shows current inputs at the V+ and V− terminals of the 3-level inverter, illustrating the comparison of FAMNM with and without cross-initialization (xinit)
Figure 14:
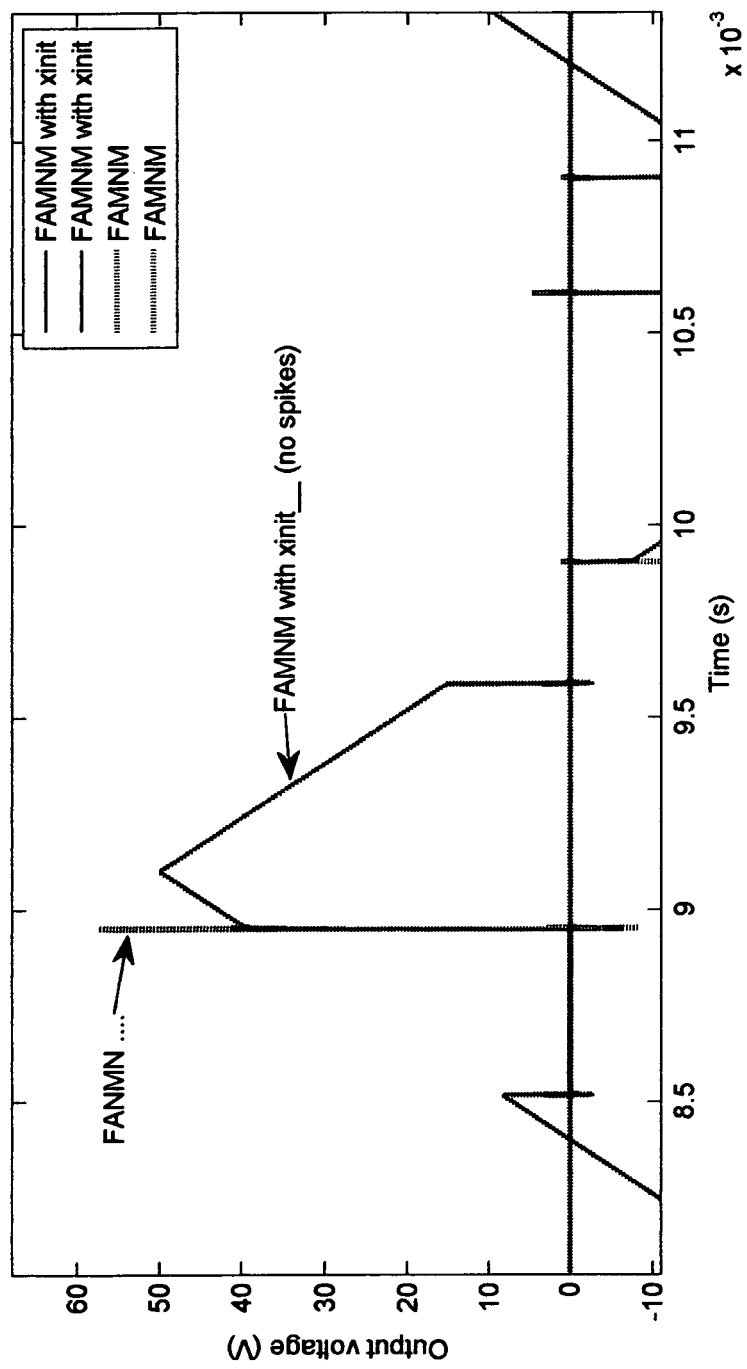
FIG. 14 shows the zoom of current inputs at the V+ and V− terminals of the 3-level inverter, illustrating the comparison of FAMNM with and without cross-initialization (xinit)

FIG. 10 diagrammatically illustrates a general purpose computer 1000 that is programmed to assist timely initiation of the controlled switches in a power converter, using information/events from or without events stored in a table. Included in the general purpose computer are memory unit 1001 comprising a data unit 1002, and an executable code or program unit 1003. The detailed structure of the units 1001, 1002 and 1003 may take one of several commercially known forms which do not need to be described in detail herein. Also included in the general purpose computer 1000 are a multicore CPU, FGPA 1005 and a GPU 1006. Also diagrammatically shown is a bus 1007, storage 1008 and a communication connection of port 1009. It is believed that details of these units 1004 to 1009 if amplified herein, would obscure the crux of the present invention. Details of general purpose computers that would be suitable in the present context are believed to be within the knowledge of one who is skilled in the art; accordingly such details are not provided herein. Any suitable CPU, field-programmable-gate-array (FPGA) or a Graphic Processing Unit (GPU), or other equivalent unit may be employed in place of the unit 1000.

FIGS. 11, 12, 13, 14 show that the simulation with FAMNM with cross-initialization ('FAMNM with xinit' in the figures), avoids the current and voltage spikes that appear with the standard FAMNM ('FAMNM' in the figures).

The power loss is almost the same in both cases. This is because the switching frequency of 1000 Hz is relatively low. In real life indeed, 3-level NPC inverters are generally used at much lower switching frequencies than 2-level inverters.

Cross-Initialization on Surrogate Circuits

The cross-initialization can also be applied to 'surrogate' circuits or equivalent circuits. To explain the surrogate circuit concept, the 3LNPCI topology is considered as an example.

The objective of the 3LNPCI topology is to apply 3 different voltage levels to the load. From a simulation point of view, it is possible to replace the original 3LNPCI topology with an equivalent one with fewer switches that will also apply 3 different voltage levels and behave similarly if logic is used to convert the switch gating.

Figure 15:
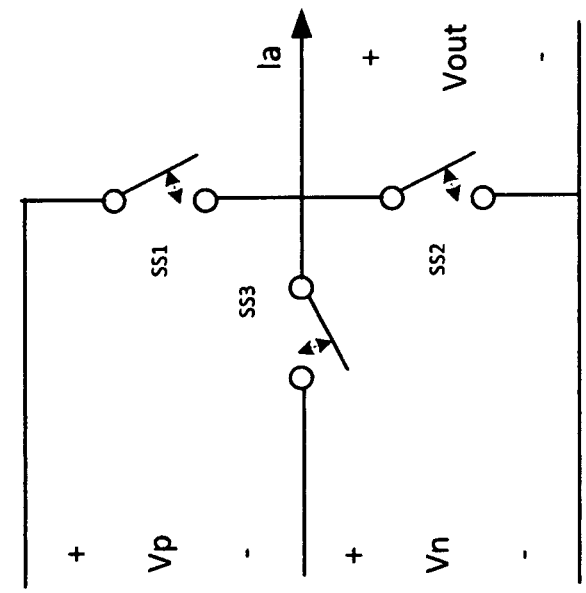
FIG. 15 shows a possible surrogate circuit (on the right) for the 3-level neutral point clamped inverter topology (on the left); and, FIG. 16 illustrates an exemplary flowchart of the algorithm of the inventive method where bold lines show the cross-initialization concept as taught herein.
Figure 15:
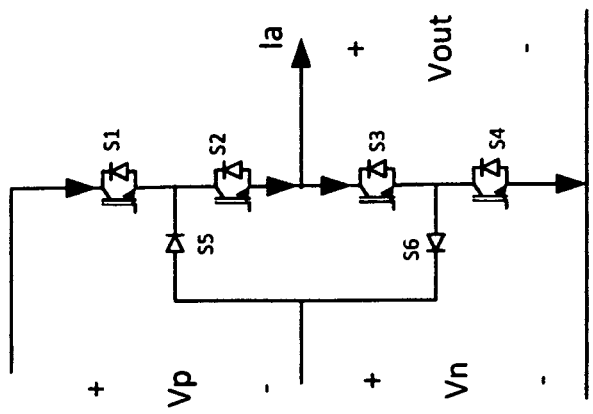

FIG. 15 depicts a possible surrogate circuit for the 3LNPCI topology. It is able to apply the 3 different voltages (V+, N, V−) to connector Ia in the image. With the use of a basic power converter for the gate logics, it can be used to replace the 3LNPCI in simulation, including real-time simulation. Basically, surrogate circuits are used to make the simulation of complex devices easier by the use of a simpler and equivalent one in simulation.

Algorithm description

Figure 16:
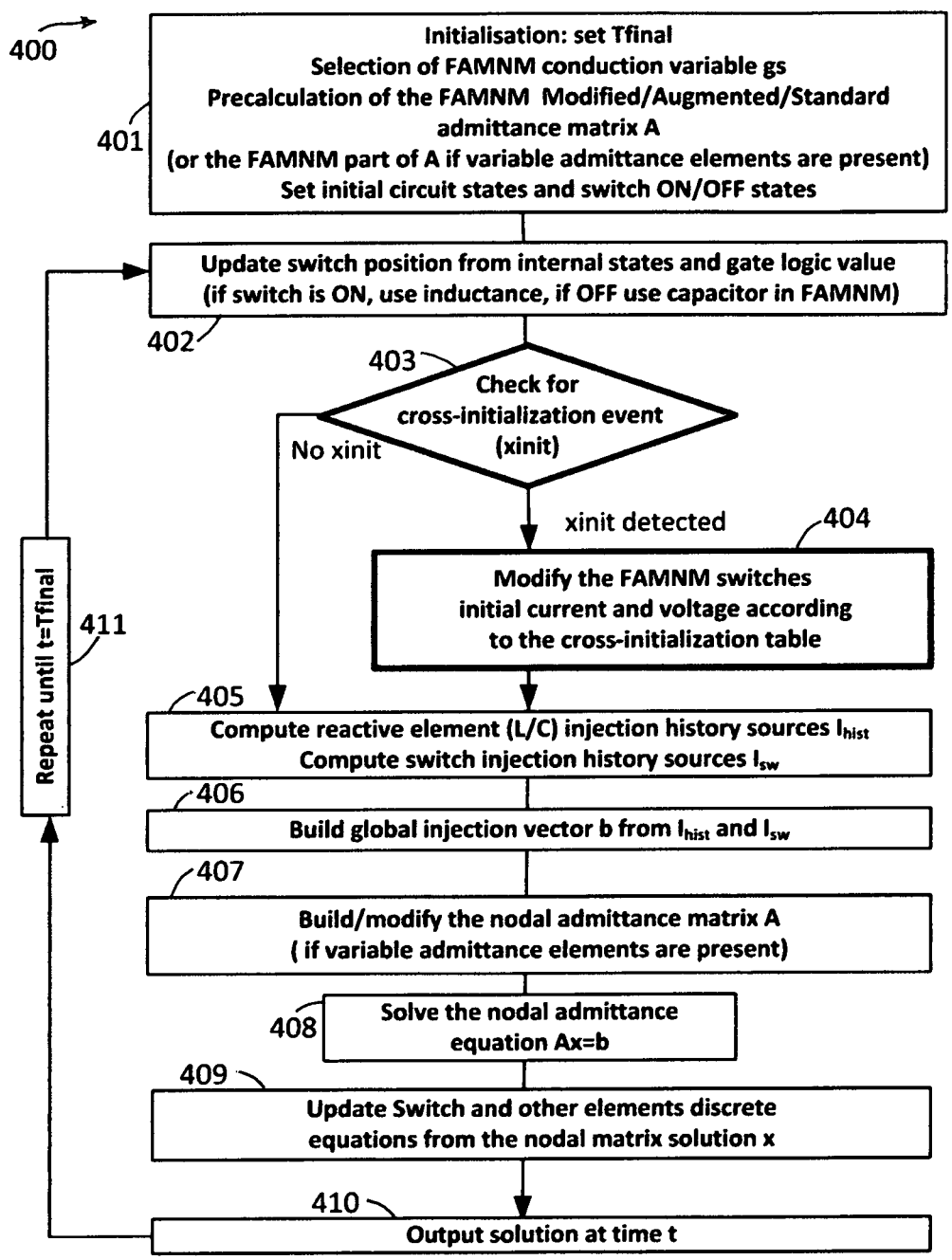

FIG. 16 illustrates the exemplary steps in the method of the present invention contributing to minimizing/eliminating FAMNM induced losses.

The FAMNM algorithm of the present invention is similar to the Dommel algorithm with the exception that the switches are considered like changing L/C elements and are controlled by cross-initialization. It is to be noted that the present invention provides an improved FAMNM algorithm by correctly initializing the initial current/voltage of the switches to minimize overshoots and simulation-induced power losses.

As illustrated exemplarily, the inventive algorithm 400 starts by initializing the internal states of the reactive elements (inductors, capacitors, transformers, etc. . . . ) and the states of switched (conducting or non-conducting) to a prescribed value. Final simulation time is set, along with the simulation time-step. With a real-time simulator, the final simulation time is often set to infinity The main simulation loop starts after the initialization stage shown in 401. In this stage, the following is done: set the final time of simulation, select the gs conductance value of FAMNM, precompute the fixed part of the admittance matrix (i.e. the part that contains the FAMNM switches), and set initial conditions for the various elements of the systems being simulated.

In step 402, the algorithm reads the results of the previous simulation time-step, with the exception of the first time-step. From these results, the switch status values are updated according to their governing electrical-laws, such as for example, a diode will turn ON if the voltage across it is greater than its threshold voltage.

In step 403, cross-initialization events are checked for. If some cross-initialization events are detected, the initial currents and voltages of the switches are modified according to the rules of the cross-initialization table in step 404, before proceeding to step 405. If no cross-initialization is detected, then the algorithm moves on to step 405.

In step 405 the algorithm computes the individual reactive element 'history current sources', resulting from the integration of the equations of the various branches. The term 'history current source' comes from the fact that these terms can be computed from the solution in the previous step. Integration can be done by the trapezoidal rule as in Dommel and Maguire or by the Backward Euler rule as in Opal-RT's eHS solver.

Further, in step 405, the switch FAMNM equivalent 'history current sources' are also computed at this stage and the update-equation changes with regard to the ON or OFF status. In the standard FAMNM method, these equations are typically initialized to '0' when the ON/OFF status of the switch just changed because the new FAMNM inductance or capacitance just appeared in the simulation. But when cross-initialization is carried out in the previous step, the equations of these switches have a non-zero history that limits power losses, over-voltages and over-currents.

The next stage in step 406 is to build the so-called 'injection vector' from the 'current history sources' of the various elements to modify the admittance matrix A if required by non-linear element switches or even non-FAMNM switches. The implementation of these stages depends on the type of nodal admittance method used. In Dommel and Maguire, the standard nodal admittance method is used while the Modified Augmented Nodal Method is used in Dufour and Ould Bachir. The present invention can be applied to all variations of the nodal admittance method.

The next stage is to find the solution to the nodal (normal or augmented) admittance problem. This is an algebraic matrix problem. If the admittance matrix was modified in the previous stage, then it will have to be factorized again by what are known as LU or Cholesky methods for example. Typically, this matrix will not change in the FAMN Method because the parameters of the FAMNM switch are chosen according to Equation 1 so as to have no impact on this admittance matrix. The elimination of factorization of the admittance matrix is the major advantage of the FAMNM because it enables faster computation. Nevertheless, one can choose to allow re-factorization of the admittance matrix for some special non-linear elements for example.

After the solution of the nodal admittance problem is found, the various element-update-equations are completed including the missing voltage. The required voltage, current, and other parameters are then generated as output on the CPU or FPGA memory and possibly to the corresponding analog or digital output of the real-time simulator.

The FAMNM algorithm with cross-initialization is shown exemplarily in the flow diagram illustrated in FIG. 16, where at least the bold lines illustrate the contribution of the present invention.

The algorithm of the present invention is an improvement over the prior art methods of designing simulators for switched power-electronic circuits, and includes an additional cross-initialization stage in the standard FAMNM algorithm.

Exemplary applicability details of the invention:

Non-real-time application: The invention can be used in non-real-time applications also. The most common way (without the present invention) is to increase the simulation precision is to decrease the simulation time step, thus increasing the total number of simulation time-steps, and thus the computational effort and time. This invention permits better precision with larger time-steps of simulation, whereby it can be used to accelerate simulation in non-real-time cases.

Type of power-electronic switches: Although the IGBT with anti-parallel diodes has been used as an example to describe the invention, the invention is applicable to any switchable device that can reasonably be simulated inside the FAMNM algorithm. This includes but is not limited to GTO, MOSFET, Diodes, Thyristors, Insulated Gate Commutated Thyristor for example.

It is noted that for a switch to be simulated inside a FAMNM algorithm, one must be able to approximate a switch with a binary or 2-value model, with the state 'off' modeled with a high resistance and the 'on' modeled with a low resistance. In the FAMNM algorithm, these two values of resistance translate into capacitance and inductance respectively. This includes but is not limited to IGBT, GTO, MOSFET, Diodes, Thyristors, Insulated Gate Commutated Thyristor for example.

Computational engines: The invention can by implemented in different kinds of computational engines in a real-time simulator: Micro-processors with Central Processing Units (CPUs), Field Programmable Gate Arrays (FPGAs), Graphics Processing Units (GPUs) and others that can implement the algorithm of FIG. 16.

Applicable power electronic converter or inverter topologies: there is no a priori limitation on the type or topology of power electronic converters or inverters that can be simulated with FAMNM. Therefore, the present invention also does not have any limitations about applicable converter topology. The 2LI and 3LNPCI inverter topologies described in this document are just preferred examples of application of the invention.

In the foregoing detailed description of embodiments of the invention, various features may have been grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," "second," and "third," etc., if used, are used merely as labels, and are not intended to impose numerical requirements on their objects.

The invention claimed is:

1. In a fixed admittance matrix nodal method (FAMNM) inversion-free solver in a real-time simulator of an electric controlled switching circuit having FAMNM switching devices, a method for reducing spurious losses and oscillations/spikes inside the simulator, comprising the steps of:
choosing a time interval T final and an iteration time interval $T_{step}$;
modelling each of said switching devices as a capacitor C when "off" and an inductor element L when 'on', each modelled switching device L and switching device C of L/C switching devices being subjected to controlled switching of their conduction-state;
selecting a FAMNM conduction variable gs, precalculating a FAMNM admittance matrix A, and setting initial circuit states as well as ON/OFF states; and, further comprising the iteration steps of:
iterating a circuit solution using said FAMNM and
using a programmed computer means including a storage device for cross-initializing said L/C switching devices when they change their conduction state, to a state of current and voltage which are equivalent of a steady-state-condition current and steady-state-condition voltage respectively in each sampling cycle.

2. The method as in claim 1, wherein the step of initializing comprises initializing using a topology of said switching devices, and using a cross-initialization table having prestored events and current system-states at a time of said cross-initialization.

3. The method as in claim 2, including the step of repeating iterations until T final is reached.

4. The method as in claim 2, including the step of modeling an FAMNM switch in its 'off' state using a series R-C circuit in place of said capacitor C.

5. The method as in claim 1, including the step of modeling an FAMNM switch in its 'off' state using a series R-C circuit in place of said capacitor C.

6. The method as in claim 2 including the step of ascertaining if a cross-initialization event (xinit) is detected, and if affirmative, modifying initial current and voltage values of said FAMNM switching devices.

7. The method as in claim 2, used as a part of a Standard/Augmented/Modified-Augmented nodal admittance solution-method, including the steps of computing reactive element (L/C) injection history, Ihist, and computing switch injection history, Isw; building a global injection vector "b" from said Ihist and Isw;

building/modifying admittance matrix "A" if variable admittance elements are present;

solving nodal admittance equation Ax=b; updating switch and other element equations from nodal solution x; generating an output solution at time "t"; and repeating iterations until t=Tfinal.

8. The method as in claim 1, used as a part of a Standard/Augmented/Modified-Augmented nodal admittance solution-method, including the steps of computing reactive element (L/C) injection history Ihist and computing switch injection history Isw; building a global injection vector "b" from said Ihist and Isw;

building/modifying admittance matrix "A" if variable admittance elements are present;

solving nodal admittance equation Ax=b; updating switch and other element equations from nodal solution x; generating an output solution at time "t"; and repeating iterations until t=Tfinal.

9. The method as in claim 2, including the step of adapting the method to a class of AC-DC converters comprising 2LI, 3LNPCI (3 level Neutral Point Clamped Inverter) and flying-capacitor multi-level converters, by prestoring events and current system-states for said AC-DC converters, in said cross-initialization table.

10. The method as in claim 2, including the step of adapting the method to a class of AC-AC converters, including matrix-converters by prestoring events and current system-states for said AC-AC converters, in said cross-initialization table.

11. The method as in claim 2, including the step of adapting the method to a class of DC-DC converters, including buck, boost, buck-boost and "cuk" converters by prestoring events and current system-states for said DC-DC converters, in said cross-initialization table.

12. The method as in claim 2, including the step of adapting the method to a class of line-commuted converters including but not limited to thyristor converters and HVDC converters, by prestoring events and current system-states for said line-commuted converters, in said cross-initialization table.

13. The method as in claim 7, including the step of adapting the method to using an H bridge inverter by prestoring events and current system-states for said H bridge inverter, in said cross-initialization table.

14. The method as in claim 7, including the step of adapting the method to using a surrogate circuit by prestoring events and current system-states for said surrogate circuit, in said cross-initialization table.

15. A simulator for a switched power electric circuit such as a variable speed drive motor fed by a power electronic converter/inverter using controlled switching devices said simulator being iterated at a user's chosen iteration time interval, said simulator using a fixed admittance matrix nodal method (FAMNM) inversion-free solver; wherein a controlled switching device that is 'off' is featured as a capacitor C and wherein a controlled switching device that is 'on' is featured as an inductor L, further wherein said controlled switches are arranged to operate with a predetermined switching pattern that is coherent with normal utilization of said controlled switching devices, said simulator comprising programmed computer means including a storage device for causing cross-initialization of said controlled switches at switching transition time instants as follows:

(1) by re-initializing a new C voltage that appears at a switch position that is turning 'off' at a given iteration time-step $T_{step}$ with a voltage that is equal to a computed steady-state-condition voltage in said circuit; and;

(2) by re-initializing a new L current that appears at a switch position that is turning 'on' at a given iteration time-step $T_{step}$ with a current that is equal to a computed steady-state-condition current in said circuit, thereby to minimize spurious losses and oscillations/spikes inside the simulator.

16. A simulator as in claim 15, in which the time of calculation of each iteration is different from the real world time thereby enabling the simulator to operate in non-real-time off-line simulation and batch simulation modes.

17. A simulator as in claim 15, in which the time of calculation of each iteration is exactly the same as in the real world time thereby enabling to interface the simulator with external devices provided with input and output interfaces, thereby enabling the simulator for Hardware-In-the-Loop real-time simulation and testing.

18. The simulator as in claim 15 wherein said programmable computer means is chosen from a group comprising a CPU, a field-programmable-gate-array (FPGA) and a Graphic Processing Unit (GPU) as part of said means for causing cross-initialization to enable performing s a id cross-initialization as well as performing iterations.

19. The simulator as in claim 15, wherein said controlled switching devices are chosen from the group comprising IGBT, GTO, MOSFET, Diodes, Thyristors, and Integrated Gate Commutated Thyristors (IGCT), MOS-controlled thyristor.

20. The simulator as in claim 15, wherein said programmed computer means is programmed to model the FAMNM switch in its 'off' state with a series R-C circuit in place of said capacitor C.

21. The simulator as in claim 15, wherein said power electronic converter/inverter is chosen from a group comprising a DC-AC converter, including a 2LI two level inverter with an H-bridge configuration, cascaded-H-bridge converter, a 3LNPCI Inverter and flying-capacitor multi-level converter.

22. The simulator as in claim 15 wherein said power electronic inverter comprises a converter chosen from a group comprising an AC-AC cyclo-converters, matrix-converters, DC-DC converters, buck, boost, buck-boost and cuk converters, and line-commuted converters, as well as thyristor converters, and HVDC converters.

23. The simulator as in claim 15, wherein said programmed computer means includes means for fault testing.

24. A simulator for a switched power electric circuit such as a variable speed drive motor fed by a power electronic converter/inverter using controlled switching devices said simulator being iterated at a user's chosen iteration time interval, said iteration interval chosen to address both real-time and non-real-time operations, said simulator using a fixed admittance matrix nodal method (FAMNM) inversion-free solver wherein a controlled switching device that is 'off' is featured as a capacitor C and wherein a controlled switching device that is 'on' is featured as an inductor L, said L/C values chosen to keep the global admittance matrix constant, further wherein said controlled switches are arranged to operate with a predetermined switching pattern that is coherent with normal utilization of said controlled switching devices, said simulator comprising a programmed computer means including a storage device for causing cross-initialization of said controlled switches at switching transition time instants as follows:

(1) by re-initializing a new "C" voltage that appears at a switch position that is turning 'off' at a given iteration time-step $T_{step}$ with a computed steady-state-condition-voltage value that is obtainable if a corresponding switching device were replaced by a two-value resistor used in standard/augmented/modified augmented admittance methods; and;

(2) by re-initializing a new "L" current that appears at a switch position that is turning on' at a given iteration time-step $T_{step}$ with a computed steady-state-condition-current value that is obtainable if a corresponding switching device were replaced by a two-value resistor used in standard/augmented/modified-augmented admittance methods, thereby to minimize spurious losses and oscillations/spikes inside the simulator, said programmed computer means comprising a cross-initialization-enabling program including prestored events and current system-states using on-line computation at a time of said cross-initialization.

25. A simulator as in claim 24 wherein said power electronic converter/inverter is chosen from a group comprising AC-AC, AC-DC and DC-DC converters including 2LI (2 Level Inverters with one switch pair), 3LNPCI (3Level Neutral Point Clamped Inverters), flying-capacitor multi-level converters, matrix-converters, cascaded-H-bridge converters, cyclo-converters, buck, boost, buck-boost and "cuk" converters.

* * * * *